United States Patent [19]
Alexandres et al.

[11] Patent Number: 5,196,779
[45] Date of Patent: Mar. 23, 1993

[54] BATTERY MAINTENANCE SYSTEM

[75] Inventors: Richard B. Alexandres, Clear Lake; Dennis P. Kindschuh, Mason City, both of Iowa

[73] Assignee: Alexander Manufacturing Company, Mason City, Iowa

[21] Appl. No.: 437,094

[22] Filed: Nov. 16, 1989

[51] Int. Cl.$^5$ .............................................. H02J 7/00
[52] U.S. Cl. ........................................ 320/14; 320/31; 320/37
[58] Field of Search ................. 320/14, 48, 13, 31, 320/37

[56] References Cited

U.S. PATENT DOCUMENTS

| | | |
|---|---|---|
| 3,786,343 | 1/1974 | Ehlers . |
| 4,302,714 | 11/1981 | Yefsky .............................. 320/14 X |
| 4,698,579 | 10/1987 | Richter et al. ........................ 320/14 |
| 4,709,202 | 11/1987 | Koenck et al. .................... 320/48 X |

Primary Examiner—R. J. Hickey
Attorney, Agent, or Firm—Hugh D. Jaeger

[57] ABSTRACT

A battery maintenance system for charging, analyzing, discharging and conditioning of a NiCad battery. The system displays voltage and capacity to determine whether or not a NiCad battery has enough capacity to power equipment for an optimal time period. The system charges the battery using a negative delta voltage method of detecting full charge, while also displaying instantaneous battery voltage. The system also analyzes the battery in a charge, discharge and recharge mode of operation, and during the charge mode the instantaneous voltage is displayed. The discharge mode discharges the battery to one volt per cell while displaying voltage and accumulative capacity alternately. The system also conditions batteries by cycling a battery through three cycles of charging, discharging and a subsequent recharge cycle.

23 Claims, 11 Drawing Sheets

BATTERY MAINTENANCE SYSTEM

CROSS REFERENCES TO CO-PENDING APPLICATIONS

This patent application is related to U.S. patent application Ser. No. 07/355,679, filed May 22, 1989, and assigned to the assignee of the present invention.

BACKGROUND OF THE INVENTION

1. Field of the Invention

The present invention pertains to a battery maintenance system, and more particularly, pertains to a battery maintenance system which charges, discharges and conditions a NiCad battery.

2. Description of the Prior Art

In the past, when NiCad batteries did not appear to be functioning, the user would throw the battery away and use a new battery. Because of the price of batteries and the economies involved, this is no longer a cost effective way of utilizing and replacing NiCad batteries.

Prior art conditioning of a NiCad battery usually occurred when the battery was fully discharged and then charged. This would usually occur by an individual placing a battery in a radio, such as a handitalkie, letting the battery become fully discharged, such as through leaving the radio on overnight, and then charging the battery to a full charge, such as over the next day. This procedure was rather crude and inefficient, and also was not always productive in reaching the optimal battery operating characteristics.

The present invention overcomes the disadvantages of the prior art by providing a battery maintenance system for charging, discharging and conditioning of NiCad batteries, especially NiCad batteries exhibiting a memory effect.

SUMMARY OF THE INVENTION

The general purpose of the present invention is a battery maintenance system which charges, analyzes, discharges or conditions NiCad batteries with a single push of a button. The system is microprocessor based.

The battery maintenance system also displays voltage, thereby indicating the time before a cycle is completed. In addition, the system displays the final voltage so one can determine if anything is wrong with the cells or the battery pack. The capacity display allows one to determine whether or not the battery has enough capacity to power equipment for the optimal time.

According to one embodiment of the present invention, the battery maintenance system includes three modes of operation. By choosing the analyze mode, the system provides a fully charged battery. The system utilizes a negative delta voltage method of detecting full charge, and instantaneous voltage is also displayed. The analyze mode performs one cycle of the following three functions: charge, discharge and recharge. During the charge function, instantaneous voltage is displayed. When the battery first reaches full charge, the system automatically switches to the discharge function of the analyze mode. As the battery is being discharged to one volt per cell, terminal voltage and accumulated capacity is displayed alternately. Accumulated capacity increases in direct proportion to the amount of current taken from the battery. When the battery has reached full discharge, the system will automatically begin recharging the battery while actual voltage and accumulated capacity is displayed.

Choosing the discharge mode, the system discharges the battery to one volt per cell. Voltage and accumulated capacity display alternately. Since the charge status at the beginning of the discharge mode is not known, the accumulated capacity may not be accurate.

The condition mode exercises batteries by automatically executing the three functions of charging and discharging for three cycles and then recharging comprising the analyze mode. At the end of each discharge function and the end of the mode (i.e., all three cycles complete), the accumulated capacity and voltage are displayed. The condition mode exercises batteries which have undergone long-term storage, or for numerous other reasons, need conditioning. This mode is particularly useful for batteries which exhibit "memory effect" or voltage depression. Conditioning of the battery is not intended for everyday use and will rarely be needed for a properly maintained battery. If a battery is experiencing "memory effect", the capacity reading will increase after the battery goes through the second charge/discharge function. This is due to the fact the "memory effect" is the result of voltage depression.

One significant aspect and feature of the present invention is a battery maintenance system which charges, analyzes, discharges and conditions NiCad batteries. The system displays voltage providing an indication of how long before a mode is completed. The capacity display provides an indication of whether the battery has enough capacity to power equipment for an optimal time period.

Another significant aspect and feature of the present invention is a battery maintenance system which utilizes an LCD display to indicate the mode of operation, the voltage of the battery, and the capacity of the battery.

Another significant aspect and feature of the present invention is a battery charging system which can be used as a charger, in addition to a diagnostic system for conditioning the battery, especially batteries exhibiting "memory effect".

Having thus described embodiments of the present invention, it is a principal object hereof to provide a battery maintenance system.

One object of the present invention is to provide a battery maintenance system which charges, analyzes, discharges and conditions batteries.

Another object of the present invention is a battery maintenance system which runs diagnostic checks on batteries.

A further object of the present invention is a battery maintenance system which is useful in conditioning batteries which exhibit the "memory effect". By conditioning the battery experiencing a memory effect, the capacity will increase after the battery goes through charge/discharge cycles under control of the battery maintenance system.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIGS. 2A-1, 2A-2 and 2B illustrate a schematic diagram of the battery maintenance system;

DESCRIPTION OF THE PREFERRED EMBODIMENTS

Figure 1:
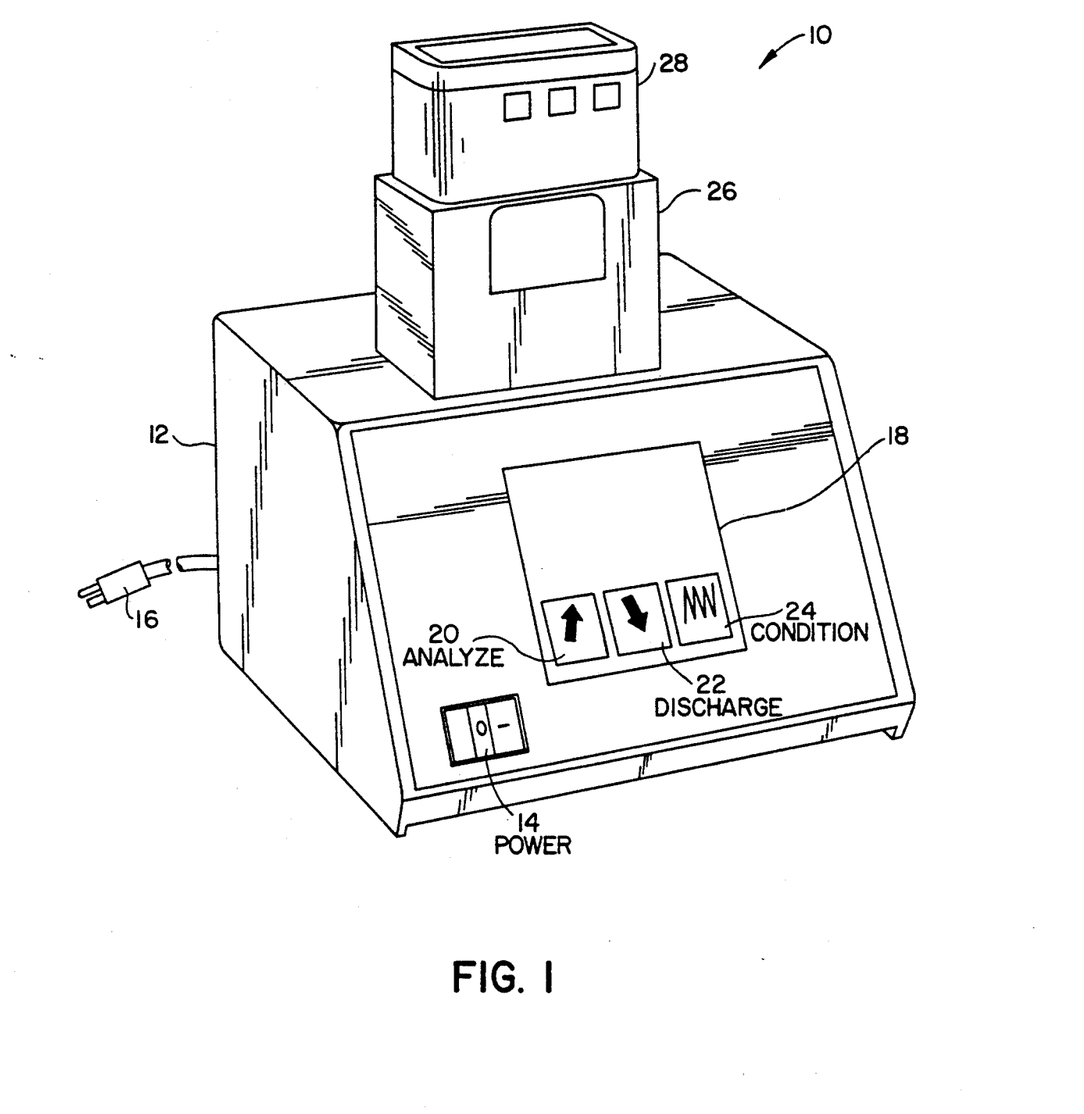
FIG. 1 illustrates a perspective view of the battery maintenance system.

FIG. illustrates a perspective view of the battery maintenance system 10, the present invention, including an electrical housing 12 with a power switch 14, a power cord 16, an LCD or like display 18, an analyze switch 20, a discharge switch 22, and an condition switch 24. A battery housing 26 positions on top of the electrical housing 12 and accepts a NiCad battery 28. Copending patent application to Alexandres et al., U.S. Ser. No. 07/355,679, filed May 22, 1989, entitled "Method and Apparatus for Measuring the Voltage and Charge of a Battery", assigned to the same assignee and incorporated herein by reference discloses a display similar to LCD display 18.

Figure 2A:
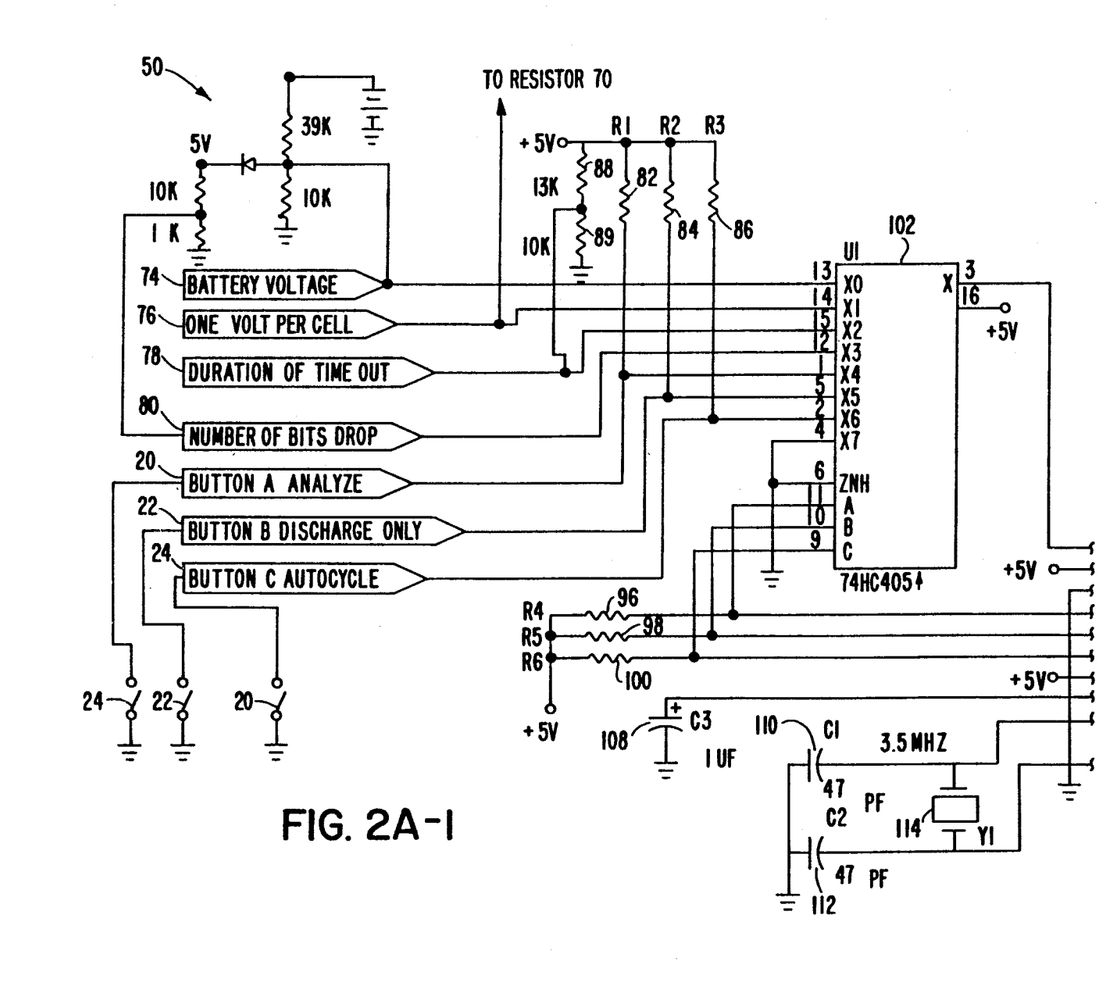
Figure 2A:
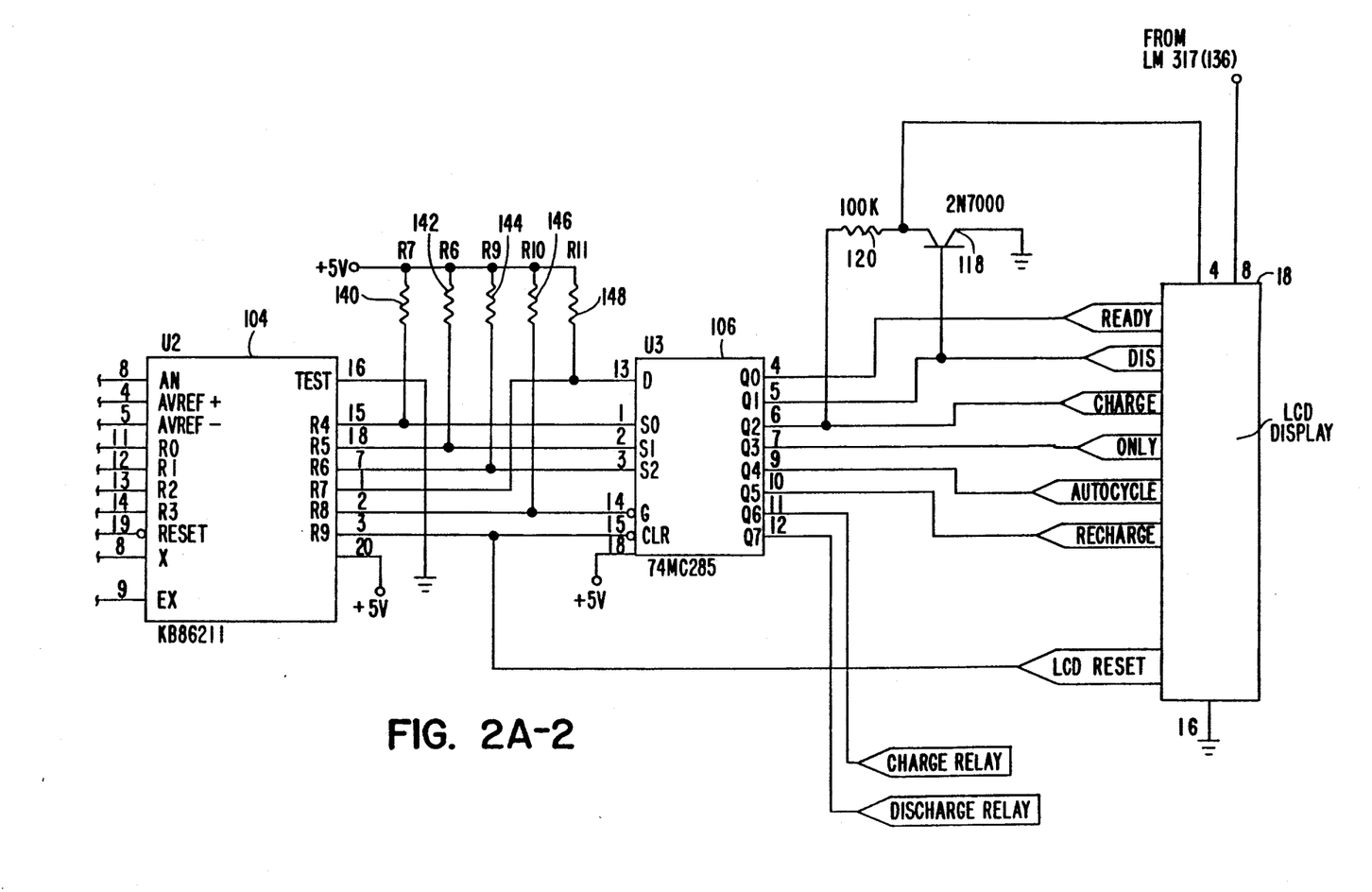
Figure 2B:
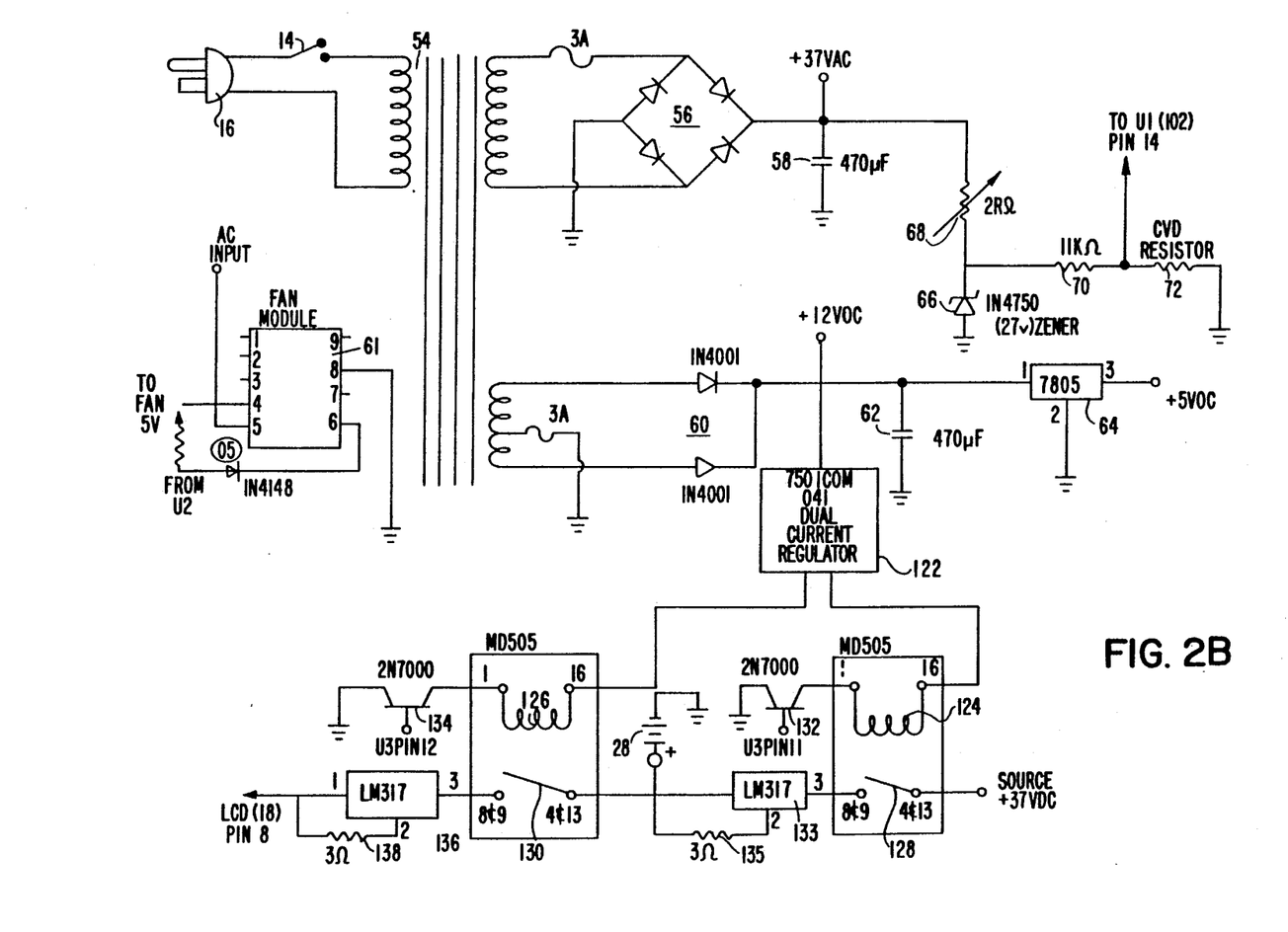

FIGS. 2A and 2B illustrate an electrical schematic diagram 50 for the battery maintenance system 10. The power supply circuit includes the power cord 16 and the power switch 14, connected to a transformer 54. The full wave bridge rectifier 56 and filter capacitor 58 provides source voltage. A half-wave bridge rectifier 60, filter capacitor 62, and voltage regulator 64 provides plus five volts DC. A zener diode 66, variable resistor 68, and resistors 70 and 72 provide a reference voltage equivalent to 1 volt per cell at pin 14 of integrated circuit 102 (U1), or any other predetermined reference voltage.

The four analog inputs to integrated circuit 102 (U1) are battery voltage 74, 1 volt per cell 76, duration of time out 78 and number of bits dropped 80. Button A corresponds to the analyze switch 20, button B corresponds to the discharge switch 22, and button C corresponds to the condition switch 24. Resistors 82-100 are pull up resistors and are 10 K Ohms by way of example and for purposes of illustration only and not to be construed as limiting of the present invention. Integrated circuit 102 (U1) is an analog multiplexer.

Integrated circuit 104 (U2) is a microprocessor. Capacitor 108 provides a power on reset for the microprocessor. Capacitors 110, 112 and crystal 114 are for the timing of the microprocessor 104 (U2). The microprocessor 104 (U2) is programmed with the listing of appendix 1 and according to the flow charts of FIGS. 4A–4F. Any other suitable microprocessor can be utilized, as well as any other programmed instructions while the substance of the flow charts are followed according to the teachings of the present invention. Integrated circuit 106 (U3) is a demultiplexer with outputs to the LCD display 18. A MOSFET 118 and resistor 120 control the switching of the LCD display 18. A dual current regulator 122 connects to the half wave bridge rectifier 60 and to the coils 124 and 126 of relay contacts 128 and 130, respectively. MOSFETS 132 and 134 are connected to relay coils 124 and 126, respectively, to ground, and to the integrated circuit 106 (U3) for triggering relay contacts 128 or 130 to either charge or discharge the battery 28. A current regulator 133 and resistor 135 connect to the relay contacts 128 to provide charging for the battery 28. Another current regulator 136 and a resistor 138 connect to the relay contacts 130 for discharging of the battery 28 through the load between pins 8 and 16 of the LCD display 18. Resistors 140-148 are pullup resistors. Resistor values indicated are intended for purposes of illustration only and are not to be construed as limiting of the scope of the invention. A fan module 61 is used to power an AC operated fan under microprocessor control for optional systems which have capacity for multiple batteries.

Figure 3:
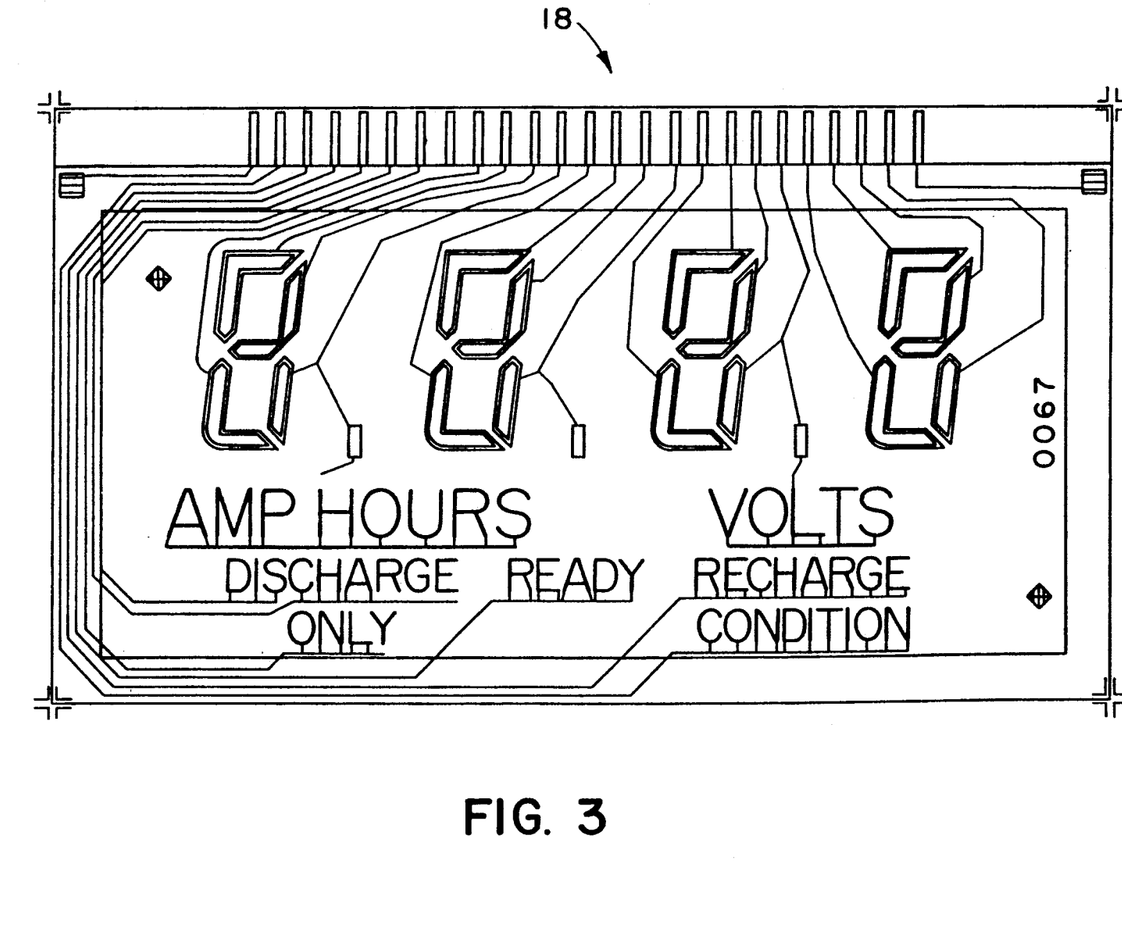
FIG. 3 illustrates a top view of the LCD display panel.
Figure 4A:
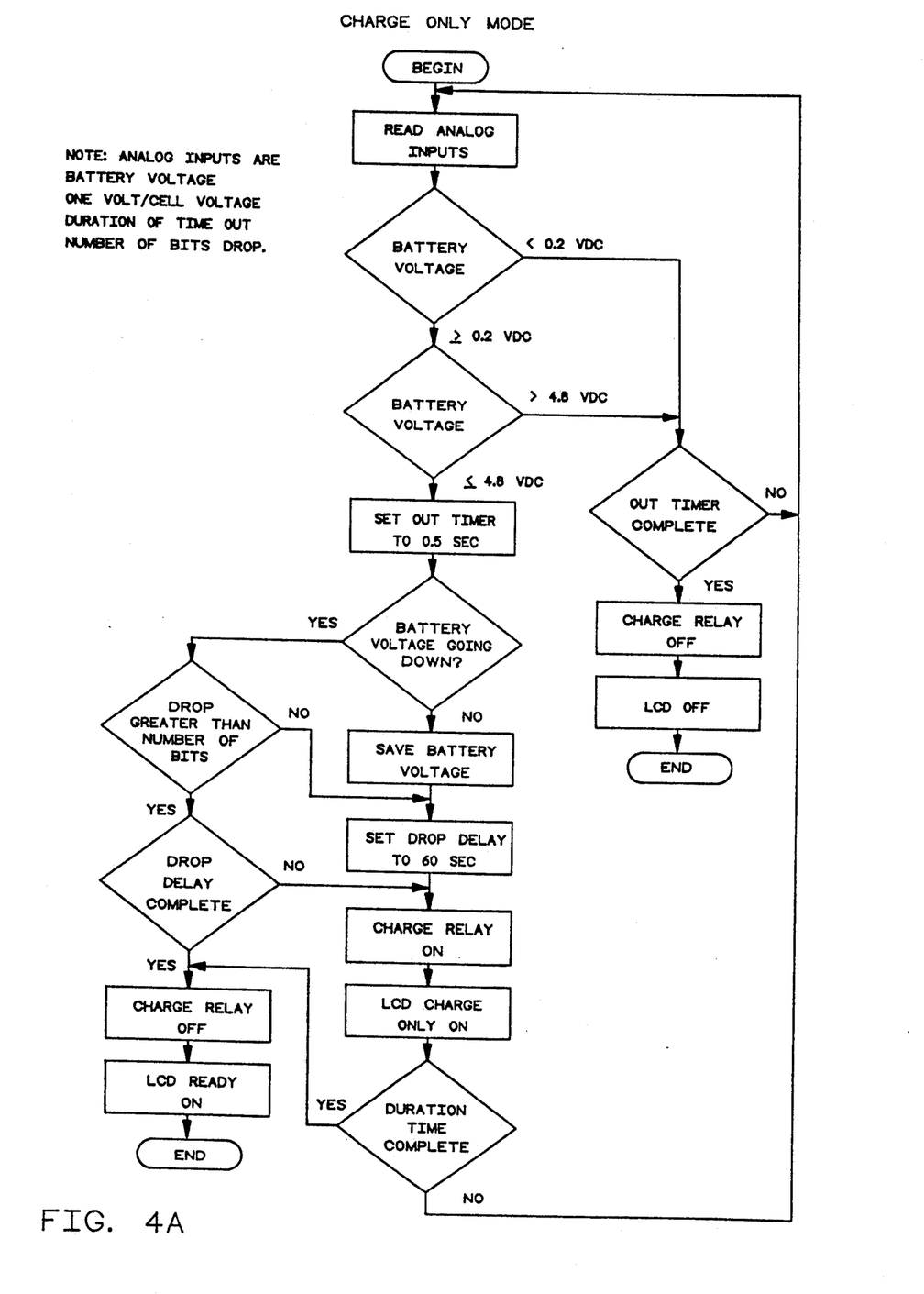
FIGS. 4A–4F illustrate the flow charts for the charge, discharge, and analyze modes.
Figure 4B:
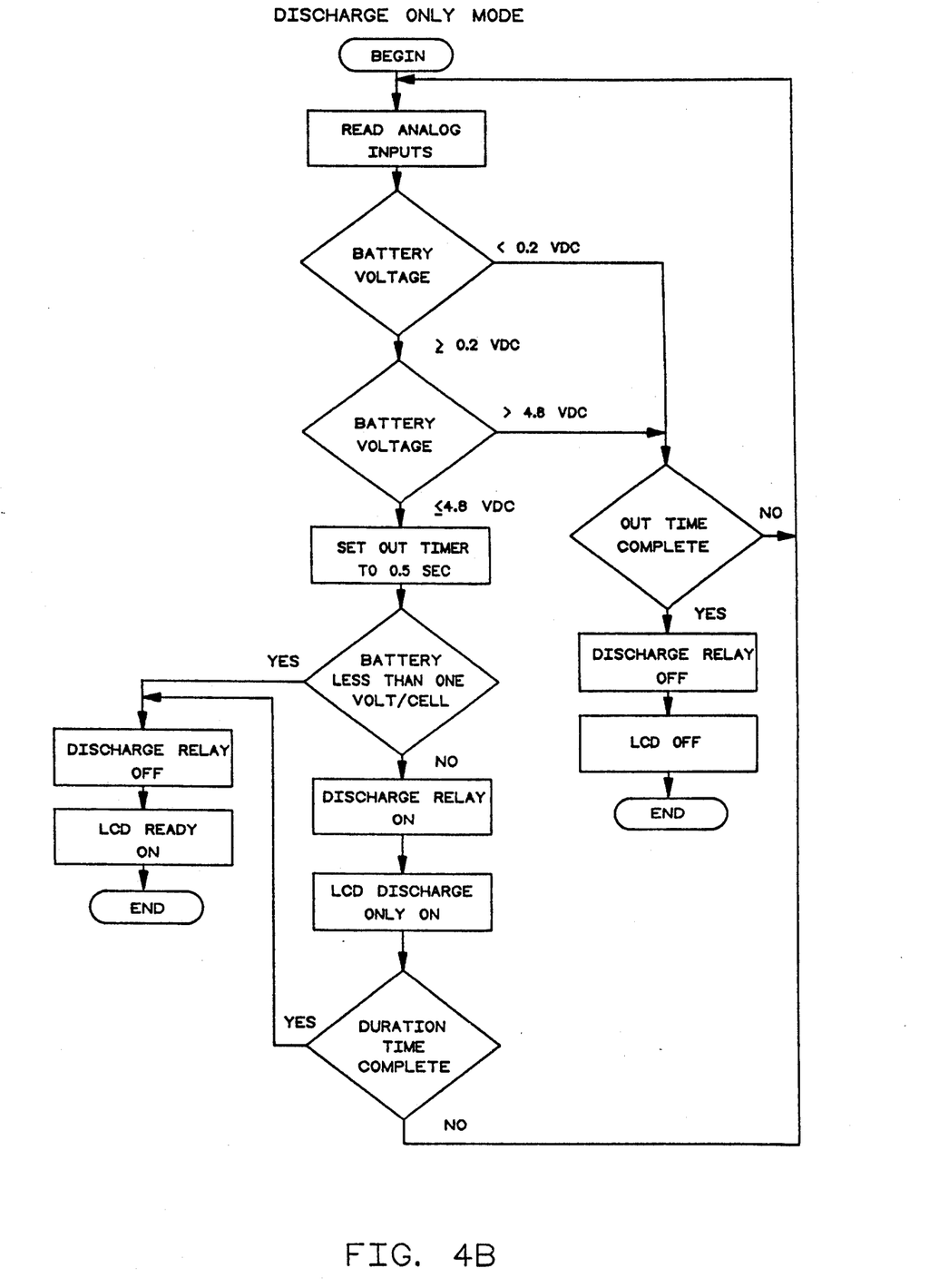
Figure 4C:
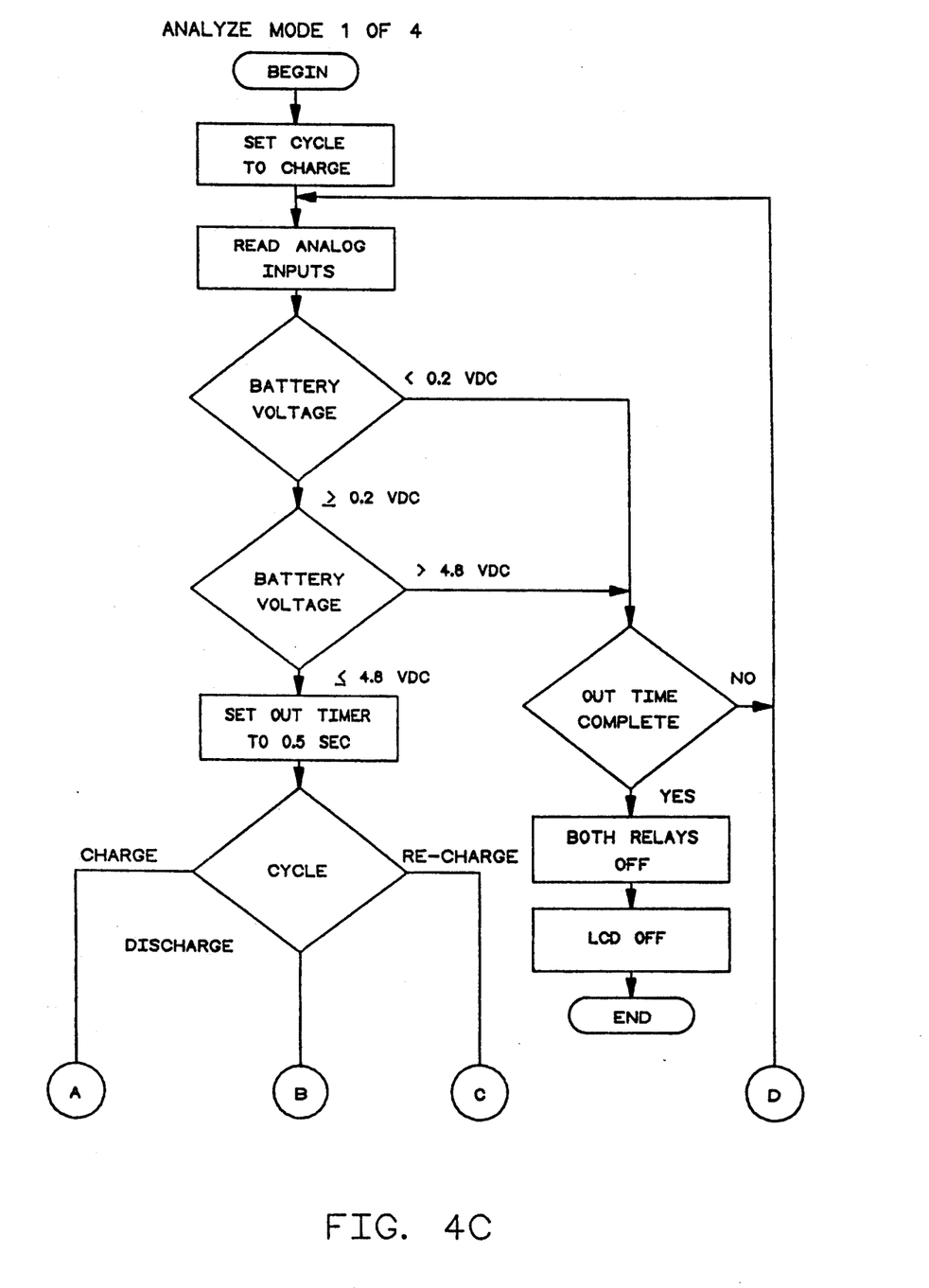
Figure 4D:
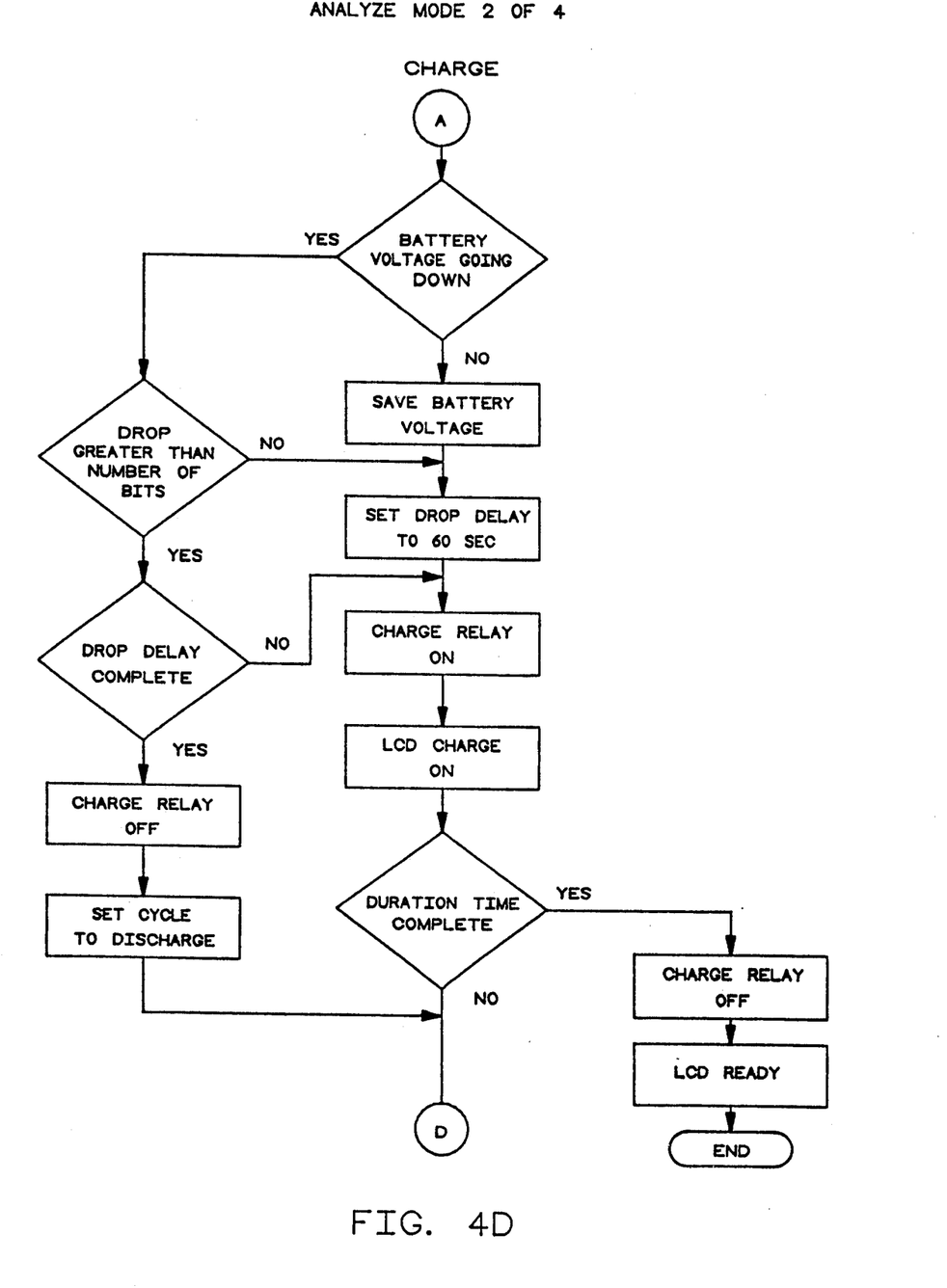
Figure 4E:
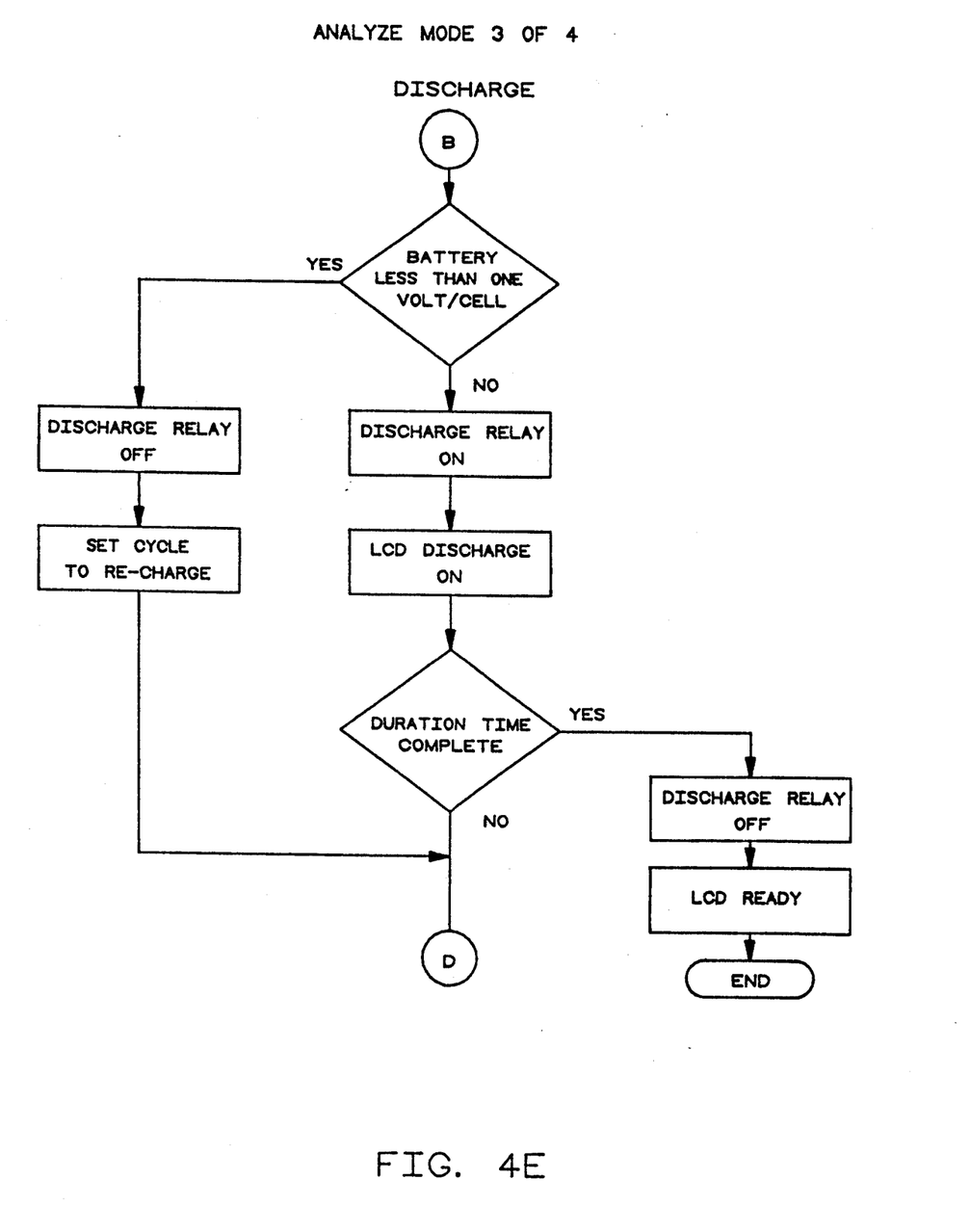
Figure 4F:
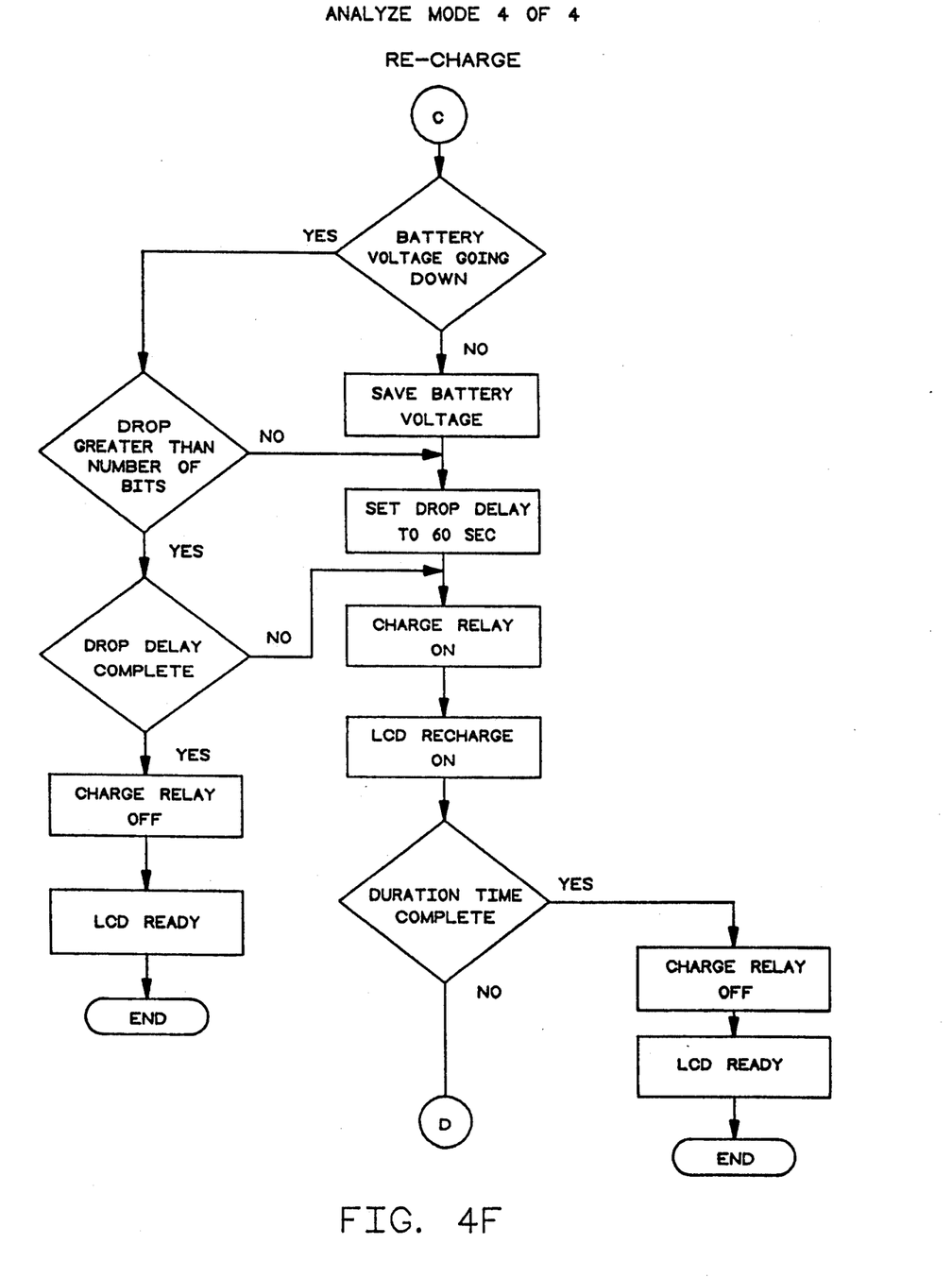

FIG. 3 illustrates a top view of the LCD display 18. As shown, it contains four variable digits, a movable radix point, and fixed mode indicators.

MODE OF OPERATION

The battery maintenance system charges, analyzes, discharges or conditions batteries with just the push of a button. By choosing the analyze or charge mode of FIG. 4A, the system fully charges the battery and utilizes a negative delta voltage method of detecting full charge, as discussed in U.S. Pat. No. 07/355,679, by Alexandres et al, entitled "Method and Apparatus for Measuring the Voltage and Charge of a Battery", and assigned to the same assignee as this patent application. Choosing the discharge mode of FIG. 4B discharges the battery to one volt per cell. Voltage and accumulated capacity flash alternately on LCD display 18. Since the charge status at the beginning of the discharge mode is not known, the accumulated capacity may not be accurate. The analyze mode of FIGS. 4C–4F includes three functions: charge, discharge and recharge. During the charge portion, instantaneous voltage is displayed. When the battery reaches full charge, the unit automatically switches to the discharge portion of the analyze mode. As the battery is being discharged to one volt per cell, terminal voltage and accumulated capacity is displayed alternately. Accumulated capacity increases in direct proportion to the amount of current taken from the battery. When the battery has reached a full discharge, the unit will automatically begin recharging the battery. The capacity will remain while the voltage increases. The condition mode exercises batteries by automatically charging and discharging a total of three cycles and then recharging. At the end of each cycle and the end of the mode, the final capacity and voltage are displayed. This mode exercises batteries which have undergone long-term storage or, for numerous other reasons, need conditioning. This mode is particularly useful for batteries which exhibit "memory effect" or voltage depression. It's not intended for everyday use and will rarely be needed on a properly maintained battery. If a battery is experiencing "memory effect", the capacity reading will increase after the battery goes through the second charge/discharge cycle. This is due to the reason that "memory effect" creates the effect of lower battery capacity. Not only does displaying voltage give one an idea of how long before the cycle is completed, it also lets one know the final voltage so that one can determine if anything is wrong with the cells or battery pack. In addition, the battery maintenance system lets one know final capacity so that one can determine whether or not the battery has enough capacity to power the equipment for the desired time.

Table 1 below indicates the voltage input table for time out duration and the bits dropped voltage for the battery charging system.

TABLE I

| Bits Drop | Time Out Hours | Voltage Input |
|---|---|---|
| 2 | 0 (no time out) | 0 to 0.26 v |
| 3 | 1 | .47 +/− .1v |
| 4 | 2 | .78 +/− .1v |
| 5 | 3 | 1.09 +/− .1v |
| 6 | 4 | 1.41 +/− .1v |
| 7 | 5 | 1.72 +/− .1v |
| 8 | 6 | 2.03 +/− .1v |
| 9 | 7 | 2.34 +/− .1v |
| 10 | 8 | 2.66 +/− .1v |
| 11 | 9 | 2.97 +/− .1v |
| 12 | 10 | 3.28 +/− .1v |
| 13 | 11 | 3.59 +/− .1v |
| 14 | 12 | 3.91 +/− .1v |
| 15 | 13 | 4.22 +/− .1v |
| 15 | 14 | 4.53 +/− .1v |
| 255 | 15 | 4.74 to 5v |

The divider values for resistor 70 and resistor 72 are the 11K and the cup resistor to develop the equivalent of one volt per cell. The time outs and bits dropped can be expanded for cells or as desired. While the teachings of this invention have been illustrated for a one unit charger, it is only necessary to expand the system according to the teachings of the present invention to a charging unit for more than one battery.

The analog inputs for the battery voltage, the one volt/cell voltage, the duration of the time out and the number of bit drops is inputted at terminals 74, 76, 78 and 80, respectively, by an analog input for the battery voltage of terminal 74, by the zener 66 and the divider for the one volt per cell at terminal 76, and by analog inputs for terminal 74, 78 and 80.

Once the system is switched on, the unit will initialize in less than five seconds. After initialization, the unit will display 0.00 volts for three second, and then 0.000Ah will be displayed for three seconds. These will then alternate on the display until the power is removed or a battery is inserted into the corresponding adapter. Upon insertion of a battery after the unit has initialized, the word "READY" will flash on the display. One then has approximately 20 seconds to select one of the three modes. If one takes no action during the 20 seconds the "READY" is flashing, the unit will switch to the charge only mode. This means the word "CHARGE ONLY" will be displayed. Once this occurs, there is nothing you can do to override this mode other than turn the system off, or remove the battery.

The analyze mode has three modes of operation: charge, discharge and recharge. During the charge portion of the analyze mode, instantaneous voltage will be displayed. During the discharge or recharge mode, The displays will alternate every three seconds. When the battery reaches full charge, the system will switch to the discharge portion of the analyze mode.

During the discharge mode, the display will show "DISCHARGE". This will continue to be displayed while the battery is undergoing the discharge portion of the analyze mode. During the discharge mode, the battery will be drained at a rate which has yet to be determined. Prototypes are at 500 mA +/− 25 Ma by way of example and for purposes of illustration only, but any reasonable rate can be predetermined and set. This rate will be standardized with an electable option of setting the rate in the field through programming. During discharge, the display will alternate between terminal voltage and accumulated capacity. Accumulated capacity increases in direct proportion to the amount of current taken from the battery. When the battery is depleted to one volt per cell, the display will show "RECHARGE".

During the recharge mode, the accumulated capacity will continue to be displayed while alternating with the voltage. This allows the user to know capacity as well as check to see how close the battery is to being fully recharged.

When the cycle (charge, discharge, recharge) is completed, the display will alternate ending voltage and accumulated capacity. The word "READY" will also be displayed, but not flashing.

If the battery is removed while under test, the unit resets, initializes and is then ready for the next battery. If you insert a battery and do not want the charge mode, one must select one of the other modes by pushing one of the pressure-sensitive buttons on the front under the corresponding battery and adapter. This selection must occur during the first 20 seconds while the "READY" is flashing. If you do not choose a mode, the unit will go into the charge only mode. "CHARGE ONLY" will be displayed. Three seconds of 0.000 Ah followed by three seconds of instantaneous voltage will be displayed. When the battery reaches full charge, the unit will switch to ready and a steady "READY" displayed.

If one chooses the discharge mode, symbolized with a downward arrow on the button, the unit will go into the "discharge only" mode, and "DISCHARGE ONLY" will be displayed. The battery will be discharged to one volt per cell. The display will indicate volts and accumulated capacity just as it does during the discharge portion of the analyze mode. However, since one does not know the charge status at the beginning of the discharge only mode, the accumulated capacity may not be accurate.

When the condition mode is selected and symbolized on the button, the unit will charge, discharge, reset charge, discharge, reset, charge, discharge and finally recharge the battery. This amounts to three charge/discharge cycles. At the end of the condition mode, the final capacity and voltage will be displayed. This is intended as an exercise for batteries which have undergone long-term storage or, for numerous other reasons, need conditioning. The battery maintenance system is not intended for everyday use and will rarely be needed on a properly maintained battery.

Various modifications can be made to the present invention without departing from the apparent scope hereof. The charge, discharge, and recharge cycles can occur in any predetermined order as so desired. The order of the cycles can be prearranged in any other predetermined order. The disclosure is not to be construed as limiting of the order, and is presented by way of example and for purposes of illustration only. Further, the system can be solely used as a battery charger only.

We claim:

1. A method of determining the need for charging a nickel cadmium battery, comprising:
   a. sensing the battery voltage of said battery;
   b. when said sensed battery voltage is greater than or equal to a first predetermined voltage and less than or equal to a second larger predetermined voltage, setting a timer out to a first short time and analyzing whether said battery voltage is diminishing; and,
   c. When said analysis reveals that said battery voltage is not diminishing, saving said battery voltage, setting a drop delay to a second longer time and charging said battery.

2. The method of claim 1, further comprising providing a readout of said battery voltage.

3. The method of claim 1, wherein said first predetermined voltage is 0.2 volts DC.

4. The method of claim 1, wherein said second larger predetermined voltage is 4.8 volts DC.

5. A method of determining whether to discharge a nickel cadmium battery, comprising:
   a. sensing the voltage per cell of said battery;
   b. when said sensed voltage per cell is greater than or equal a first predetermined voltage and less than or equal to a second predetermined voltage, setting a timer out to a first short time and analyzing whether said voltage per cell is less than one volt; and,
   c. when said analysis reveals that said voltage per cell is not less than one volt, discharging said battery.

6. The method of claim 5, further comprising providing a readout of said voltage per cell.

7. The method of claim 5, further comprising providing a readout of the accumulated capacity of said battery.

8. The method of claim 5, wherein said battery is discharged to one volt per cell.

9. The method of claim 5, wherein said first predetermined voltage is 0.2 volts DC.

10. The method of claim 5, wherein said second larger predetermined voltage is 4.8 volts DC.

11. A method of conditioning a nickel cadmium battery comprising:
    a. sensing the battery voltage of said battery;
    b. when said sensed battery voltage is greater than or equal to a first predetermined voltage and less than or equal to a second predetermined voltage, setting a timer out to a first short time and analyzing whether said battery voltage is diminishing;
    c. when said analysis reveals that said battery voltage is not diminishing, saving said battery voltage, setting a drop delay to a second longer time and charging said battery;
    d. sensing the voltage per cell of said battery;
    e. when said sensed voltage per cell is greater than or equal to a third predetermined voltage and less than or equal to a fourth predetermined voltage, setting a timer out to the first time and analyzing whether said voltage per cell is less than a fifth predetermined voltage;
    f. when said analysis reveals that said voltage per cell is not less than the fifth predetermined voltage, discharging said battery; and,
    g. recharging said battery by repeating steps a–c.

12. The method of claim 11, further comprising repeating steps a–f prior to carrying out step g.

13. The method of claim 11, further comprising providing a readout of said voltage per cell.

14. The method of claim 11, further comprising providing a readout of the capacity of said battery during steps d–f.

15. The method of claim 11, wherein said battery is discharged in step f to one volt per cell.

16. The method of claim 11, wherein said first and third predetermined voltage are each 0.2 volts DC, and wherein said second and fourth predetermined voltages are each 4.8 volts DC.

17. The method of claim 1 wherein the first time is 0.5 seconds.

18. The method of claim 1 wherein the second time is 60 seconds.

19. The method of claim 5 wherein the first time is 0.5 seconds.

20. The method of claim 11 wherein the first time is 0.5 seconds and the second time is 60 seconds.

21. A process of charging a rechargeable battery of the type susceptible to battery memory comprising the steps of:
    a. sensing the battery voltage of the battery;
    b. determining if the sensed battery voltage is less than a first predetermined voltage and, if so, returning to step a; if not, determining if battery voltage is less than or equal to a second larger predetermined voltage and, if not, returning to step a, and if so, setting a timer out to a first short time;
    c. analyzing whether battery voltage is diminishing;
    d. if battery voltage is not diminishing, saving battery voltage and setting a drop delay to a second larger time, charging said battery;
    e. testing whether duration time is complete; and,
    f. if not, returning to step a, if duration time is complete, terminating charging.

22. The process of claim 21 wherein the first short time is approximately 0.5 seconds and the second time is approximately 60 seconds.

23. Apparatus for analyzing and conditioning a rechargeable battery susceptible to battery memory, comprising:
    a. means for sensing battery voltage of a battery;
    b. means for determining that battery voltage is greater than or equal to a first predetermined voltage and less than or equal to a second predetermined voltage and showing a timer out signal;
    c. an out timer responsive to the timer signal for timing a first short time;
    d. means for determining that battery voltage is not diminishing;
    e. a drop delay timer responsive to the means for determining that battery an voltage is not diminishing for timing a second longer time;
    f. means for sensing voltage per cell of the battery and for determining when the sense voltage is greater than or equal to a third predetermined voltage or less than or equal to a fourth predetermined voltage, the means for sensing including means for setting the out timer to the first time and analyzing whether the voltage per cell is less than a fifth predetermined voltage; and,
    g. means responsive to the means for sensing for discharging the battery and for activating the first means for sensing battery voltage for restarting a cycle of analyzing.

* * * * *